United States Patent [19]
Yoshihara

[11] Patent Number: 6,117,486
[45] Date of Patent: Sep. 12, 2000

[54] PHOTORESIST COATING METHOD AND APPARATUS

[75] Inventor: Kosuke Yoshihara, Kumamoto-ken, Japan

[73] Assignee: Tokyo Electron Limited, Tokyo, Japan

[21] Appl. No.: 09/047,401

[22] Filed: Mar. 25, 1998

[30] Foreign Application Priority Data

Mar. 31, 1997 [JP] Japan ..................................... 9-081008
Jan. 9, 1998 [JP] Japan ................................... 10-013482

[51] Int. Cl.$^7$ ....................................................... B05D 3/12
[52] U.S. Cl. ............................ 427/240; 118/52; 427/362; 427/385.5; 437/231
[58] Field of Search ................................ 427/240, 385.5, 427/302; 437/231; 118/52

[56] References Cited

U.S. PATENT DOCUMENTS

| | | | |
|---|---|---|---|
| 4,267,212 | 5/1981 | Sakawaki | 427/240 |
| 5,405,813 | 4/1995 | Rodrigues | 437/231 |
| 5,498,449 | 3/1996 | Bae | 427/240 |
| 5,658,615 | 8/1997 | Hasebe et al. | 427/240 |
| 5,773,082 | 6/1998 | Ku et al. | 427/240 |

OTHER PUBLICATIONS

Derwent Abstract, AN 97–070585, JP 8–316120, Nov. 29, 1996.

*Primary Examiner*—Janyce Bell
*Attorney, Agent, or Firm*—Oblon, Spivak, McClelland, Maier & Neustadt, P.C.

[57] ABSTRACT

A resist coating method for forming a resist film on a substrate by supplying a resist solution to substantially a center of a substrate surface while the substrate is rotated, rotating the substrate at a low speed by decelerating the rotation of the substrate after the supply of the resist solution is terminated, and rotating the substrate at a high speed by accelerating the rotation of the substrate after the substrate is rotated at the low speed for a predetermined time-period.

20 Claims, 10 Drawing Sheets

PHOTORESIST COATING METHOD AND APPARATUS

BACKGROUND OF THE INVENTION

1. Field of the Invention

The present invention relates to a photoresist coating method and apparatus for coating a photoresist solution on a substrate such as a semiconductor wafer.

2. Discussion of the Background

A photolithographic process step of a semiconductor device manufacturing process includes, for example, a resist coating step for forming a photo-resist film on a semiconductor wafer (hereinafter, referred to as "wafer") and a developing step for developing a resist-coated wafer exposed to light.

To coat a resist solution uniformly over the wafer surface, a spin coating method is widely used.

In the spin coating method, a semiconductor wafer is vacuum-fixed on a spin chuck. While the semiconductor wafer is being rotated together with the spin chuck, a resist solution is supplied to a center of the surface of the semiconductor wafer from a resist nozzle which is positioned above the semiconductor wafer. The resist solution thus supplied is spread toward the circumference of the semiconductor wafer with the help of centrifugal force. Although the supply of the resist solution is terminated thereafter, the semiconductor substrate is continuously rotated in the same manner except that the rotational speed is gradually decreased. In this way, the resist solution spread over the semiconductor wafer surface is shaken off and dried.

Recently, it has been strongly desired to reduce resist consumption in order to reduce a manufacturing cost. To meet the requirement, the spin coating is generally performed by supplying the resist solution to a center of the semiconductor wafer while the wafer is being rotated at a high speed.

However, there is a problem when the semiconductor wafer is rotated at a high speed as mentioned above. That is, defects in coating, namely, ripple marks, are likely to generate on the resist film formed on the semiconductor wafer surface. The ripple marks are presumably ascribed to ripples formed of the resist solution which is supplied from the resist nozzle immediately before termination of the supply. More specifically, the resist solution supplied immediately before the termination of the resist solution supply spreads over the wafer outward in the form of ripple by the rotation of the wafer and then dry up before uniformly spread over the wafer surface. This is because the higher speed the wafer is rotated, the faster the resist solution gets dry. In this mechanism, ripple marks are considered to be left on the surface. On the other hand, with the tendency of reducing the thickness of the resist film, the resist material low in viscosity has been preferably used. With this tendency, the surface tension of the resist film decreases. As a result, the ripples are likely to appear in the resist film formed of the low-viscosity material, compared to the conventionally-used resist film.

To avoid the formation of the ripples, it is necessary to control the resist nozzle accurately to set at the center of the wafer surface. If so, the resist solution supplied can be spread concentrically to form a concentric circular ripple. It is also necessary to control the rotational speed of the semiconductor wafer to set the same at a speed which permits the resist solution to dry with such a timing that the concentric circular ripple of the resist solution reaches and passes the edge of the semiconductor wafer. However, it is very difficult to control the resist nozzle to position the same accurately and to control the rotational speed. Therefore, it has not been attained to completely avoid the formation of the ripples.

It is also difficult to control the thickness of the coated film when the amount of the resist solution supplied to each wafer is reduced. It is therefore difficult to obtain a film having a uniform thickness. Particularly in the case where the resist solution is supplied dropwise in an amount of 1.0 mL or less per wafer, the resist solution is dried before the supplied resist solution is spread outward and reach the edge of the wafer. It follows that the film thickness of the outer peripheral portion becomes thinner than that of the center portion. It is thus difficult to control the thickness of the coated film and therefore difficult to form a film in a predetermined uniform thickness.

As a method of controlling the thickness of the coated film, conventionally known are (a) a method of decreasing a speed of a resist solution spurted from a nozzle, and (b) a method of increasing the wafer rotation number when the resist solution is spurted out. However, the method (a) has a problem in that the resist solution is spurted unstably. In the method (b), the rotational velocity of the wafer cannot be increased without limitation. The increase is limited by the performance intrinsic to the coating apparatus. There is another problem in the method (b) in that the resist solution dries up too fast to control the film thickness.

BRIEF SUMMARY OF THE INVENTION

An object of the present invention is to provide a photoresist coating method and apparatus capable of coating a photoresist solution uniformly on a surface of a substrate without leaving ripples.

Another object of the present invention is to provide a photoresist coating method and apparatus capable of forming a photoresist film uniformly in a desired thickness even though the obtained film is thin.

A further object of the present invention is to provide a photoresist coating method and apparatus capable of forming a photoresist film uniformly in a predetermined thickness even if an amount of the photoresist solution supplied to a wafer dropwise is reduced.

The present invention provides a photoresist coating method comprising supplying a resist solution to substantially a center of a substrate surface while the substrate is rotated, rotating the substrate at a low speed by reducing a rotation speed of the substrate after the supply of the resist solution is terminated and, rotating the substrate at a high speed by accelerating the rotation of the substrate after the substrate is rotated at the low speed for a predetermined time-period.

The present invention provides a photoresist coating method comprising supplying a liquid agent for moisturizing a substrate surface to the substrate surface, supplying a resist solution to substantially a center of the substrate surface while the substrate with the liquid agent supplied thereon is being rotated, rotating the substrate at a low speed by decelerating the rotation of the substrate after the supply of the resist solution is terminated and, rotating the substrate at a high speed by accelerating the rotation of the substrate after the substrate is rotated at such low speed for a predetermined time-period.

The present invention provides a photoresist coating method comprising supplying a liquid agent for moisturizing a substrate surface to substantially a center of a substrate surface while the substrate is rotated, supplying a resist solution to substantially the center of the substrate surface while the substrate is rotated after the supply of the liquid agent is terminated, rotating the substrate at a low speed by decelerating the rotation of the substrate after the supply of the resist solution is terminated, and rotating the substrate at a high speed by accelerating the rotation of the substrate after the substrate is rotated at the second speed for a predetermined time-period.

The present invention provides a photoresist coating method comprising coating a resist solution by spreading the resist solution outward of a substrate while the resist solution is supplied to substantially a center of the substrate which is being rotated, controlling a film thickness uniformly by once decelerating the rotation of the substrate during the resist coating step, and shaking off an excessive resist solution by decelerating the rotation of the substrate.

The present invention provides a photoresist coating method comprising supplying a liquid agent for moisturizing the substrate surface to a surface of a substrate, coating a resist solution by spreading the resist solution outward of a substrate while the resist solution is being supplied to substantially a center portion of the substrate which is rotated, controlling a film thickness uniformly by decelerating a rotation of the once during the resist coating step, and shaking off an excessive resist solution by accelerating the rotation of the substrate.

The present invention provides a photoresist coating apparatus for coating resist by supplying a resist solution to a rotating substrate, comprising a substrate holding member for holding a substrate, a rotating device for rotating the substrate holding member at various speeds, a resist-solution nozzle for supplying a resist solution to substantially a center of the substrate surface held by the substrate holding member, a controlling section for controlling rotation of the substrate holding member, the controlling section rotating the substrate holding member holding the substrate at a predetermined speed when the resist solution is supplied, decelerating the rotation of the substrate holding member once to a speed capable of controlling the film thickness uniformly during the resist coating step, and thereafter accelerating the rotation of the substrate holding member to shake off an excessive resist solution.

The present invention provides a photoresist coating a apparatus for coating resist by supplying a resist solution to a rotating substrate, comprising a substrate holding member for holding a substrate, a rotational machine for rotating the substrate holding member at various speeds, a liquid-agent nozzle for supplying a liquid agent for moisturizing a substrate surface before a resist solution is supplied to substantially a center of the surface of the substrate held by the substrate holding member, a resist-solution nozzle for supplying a resist solution to substantially a center of the surface of the substrate held by the substrate holding member, a controlling section for controlling rotation of the substrate holding member, the controlling section rotating the substrate holding member holding the substrate at a predetermined speed when the resist solution is supplied, decelerating a rotation of the substrate holding member once to a speed capable of controlling the film thickness uniformly during the resist coating step, and thereafter accelerating the rotation of the substrate holding member to shake off an excessive resist solution.

The present invention provides a photoresist coating apparatus for coating resist by supplying a resist solution to a rotating substrate, comprising a substrate holding member for holding a substrate, a rotating machine for rotating the substrate holding member at various speeds, a resist-solution supply nozzle for supplying a resist solution to substantially a center of the surface of the substrate held by the substrate holding member, and a controlling section for rotating the substrate holding member at a first speed when the resist solution is supplied, rotating the substrate holding member at a second speed by reducing a speed to the second speed after the supply of the resist solution is terminated, and rotating the substrate at a third speed by increasing the rotation speed of the substrate holding member after the substrate holding member is rotated at the second speed for a predetermined time-period.

According to the present invention, the rotation speed of the substrate is drastically reduced after the supply of the resist solution is terminated. It is therefore possible to suppress the resist solution supplied immediately before the termination of the supply from being spread to form ripples. Thereafter, the substrate is rotated at a low speed until the resist solution is shaken off to dry. It is therefore possible to level the resist solution supplied immediately before the termination supply over the substrate and spread uniformly without being dried. In other words, it is possible to coat the resist solution uniformly without leaving ripples on the substrate surface. In addition, it is possible to suppress the reduction in film thickness since the substrate is rotated at a low speed until the resist solution is shaken off to dry. The film thickness is successfully controlled by the low speed rotation. Hence, the resist film can be formed in a desired thickness even the obtained resist film is thin.

Furthermore, according to the present invention, the resist solution is coated after the liquid agent for prewetting the substrate surface is supplied to the substrate surface. It is therefore possible to coat a resist solution uniformly on the substrate and to make a thin film even if the substrate is rotated at a low speed. Hence, the effect of the present invention: the resist solution can be coated uniformly on the substrate without leaving ripples, is more efficiently attained.

According to the present invention, the rotational speed of the substrate is reduced during the resist coating step while rotating a substrate. As a result, a force directed toward the center of the substrate is produced by the deceleration at the time of reducing the speed and acts upon the resist solution. On the other hand, the resist solution is dried slowly since the substrate is rotated at a low speed. As a result, the film is formed uniformly in thickness. The resist solution is suppressed from being spread outward by the force directing toward the center of the wafer, produced by the deceleration, with the result being that the resist solution deposited to the peripheral portion of the substrate is equal in amount to that deposited to the center portion. Even though the supply amount of the resist solution is reduced, the resist film can be formed of a uniform in thickness over the entire substrate. Hence, the present invention is effective in reducing the consumption of the resist solution.

According to the present invention, the liquid agent, such as thinner, for prewetting the surface, is supplied to the substrate surface before the resist coating. It is therefore possible to spread the resist more easily. As a result, the resist film can be formed of a uniform in thickness by supplying a small amount of the resist solution. Moreover, the consumption of the resist is successfully reduced and the resist film can be formed thin.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The coating/developing process system for a semiconductor wafer to which the present invention is applied, will now be explained with reference to FIGS. 1 to 3.

The coating/developing process system comprises a cassette station 10, a process station 11, and an interface section 12, which are contiguously formed as one unit.

In the cassette station 10, a cassette CR for storing a plurality of wafers W (e.g. 25 wafers) serving as a substrate is loaded into and unloaded from the system. The process station 11 includes various single-wafer processing units for applying a predetermined treatment required for a coating/developing step to wafers one by one. These process units are arranged in predetermined positions of multiple stages.

The interface section 12 serves for delivering the wafer W between the process station 11 and an exposure unit (not shown) abutted against the process station 11.

Figure 1:
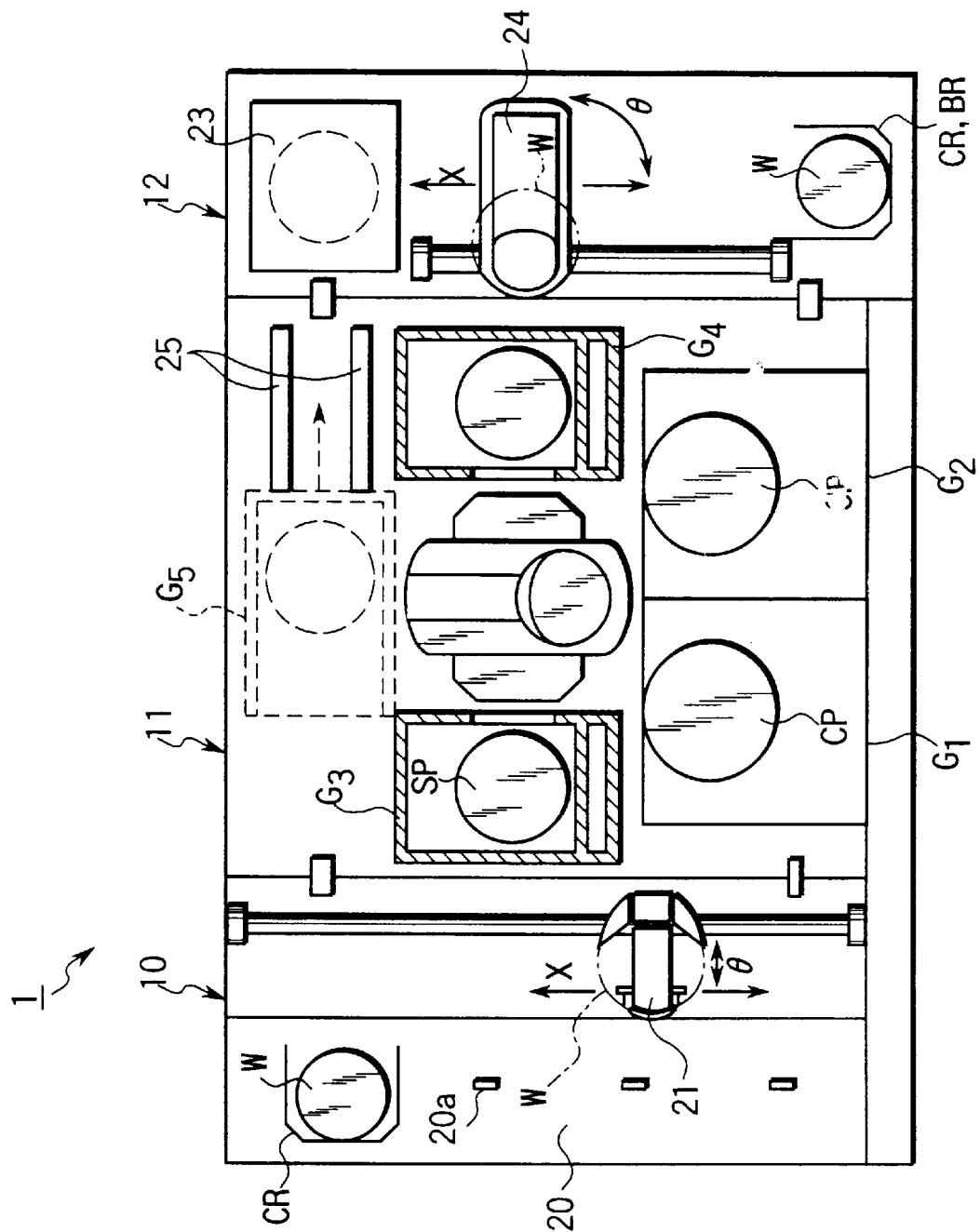
FIG. 1 is a plan view showing an entire structure of the coating/developing process system of the semiconductor wafer according to an embodiment of the present invention.

The cassette station 10 has a cassette table 20 having positioning-projections 20a thereon, as shown in FIG. 1. A plurality of wafer cassettes CR (for example, at most 4) are mounted on the positioning-projections 20a. The wafer cassettes CR are thereby aligned in line in the direction of an X-axis (the up-and-down direction of FIG. 1) with a wafer inlet/outlet allowed to face the process station 11. The cassette station 10 includes a wafer transfer carrier 21 movable in the aligning direction (X-axis) of cassettes and in the aligning direction (Z-axis, vertical direction) of wafers stored in the wafer cassette CR. The wafer transfer carrier 21 gains access selectively to each of the wafer cassettes CR.

The wafer transfer carrier 21 is further designed rotatable in a θ direction, so that it can gain access to an alignment unit (ALIM) and an extension unit (EXT) belonging to a third multiple-stage process unit group G3 in the process station 11, as described later.

The process station 11 includes a main wafer transfer mechanism 22 (movable up-and-down in the vertical direction) having a wafer transfer machine. All process units are arranged around the main transfer machine 22, as shown in FIG. 1. The process units may be arranged in the form of multiple stages.

Figure 3:
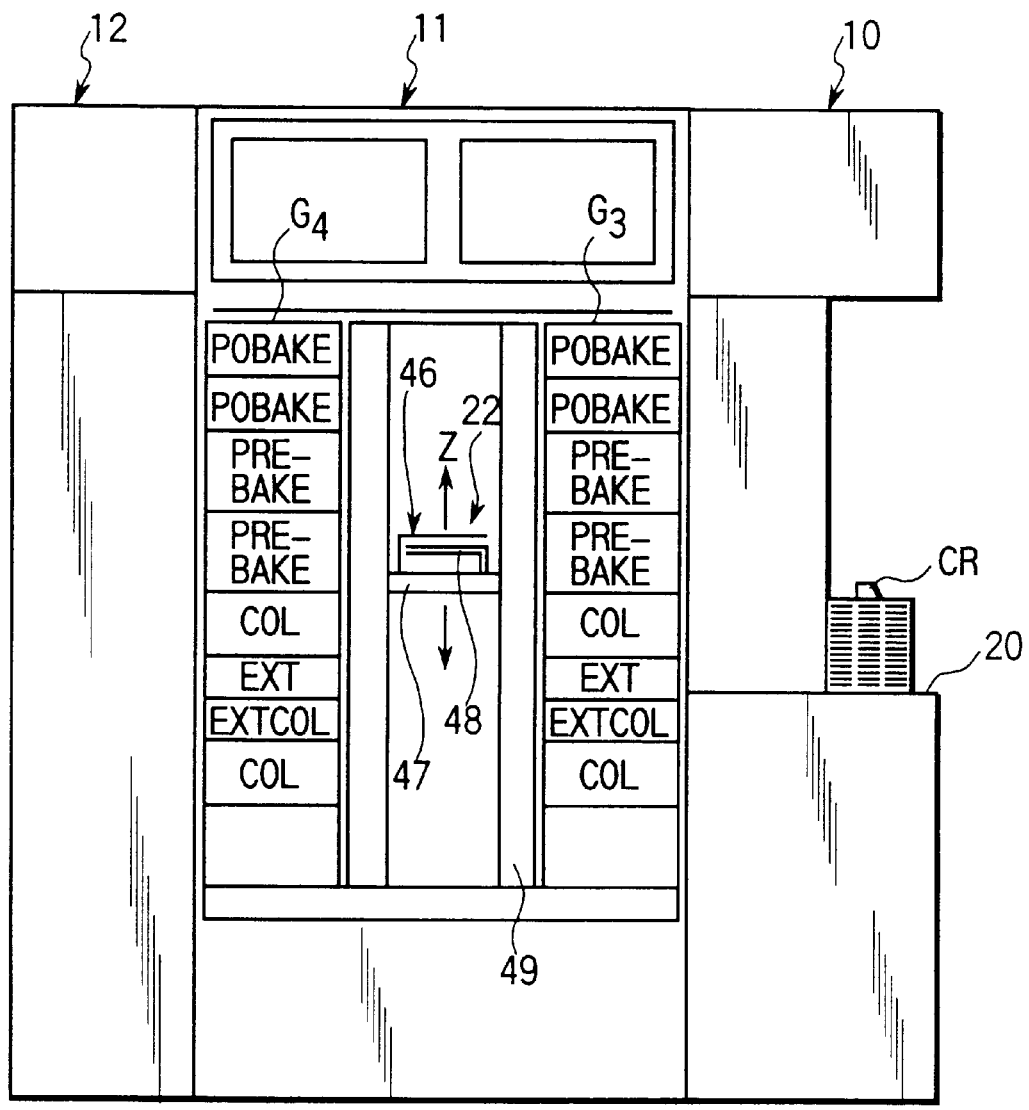
FIG. 3 is a back view showing the structure of the coating/developing process system of FIG. 1.

The main wafer transfer mechanism 22 has a wafer transfer machine 46 which is movable up and down in the vertical direction (Z-direction), within a hollow cylindrical supporter 49, as shown in FIG. 3. The hollow cylindrical supporter 49 is connected to a rotational shaft of a motor (not shown). The cylindrical supporter 49 is thereby rotated about the rotation shaft synchronously with the wafer transfer machine 46 by the driving force of the motor rotation. Thus, the wafer transfer machine 46 is rotatable in the θ direction. Note that the hollow cylindrical supporter 49 may be connected to another rotational axis (not shown) which is rotated by a motor.

The wafer transfer machine 46 has a plurality of holding members 48 which are movable back and forth on a table carrier 47. The wafer W is delivered between the process units by the holding members 48.

In the process unit station 11 of this embodiment, five process unit groups G1, G2, G3, G4, and G5 can be sufficiently arranged. For example, first and second multiple-stage process unit groups G1 and G2 are arranged in the front portion (in the forehead in FIG. 1) of the system. A third multiple-stage process unit group G3 is abutted against the cassette station 10. A fourth multiple-stage process unit group G4 is abutted against the interface section 12. A fifth multiple-stage process unit group G5 can be arranged in the back portion.

Figure 2:
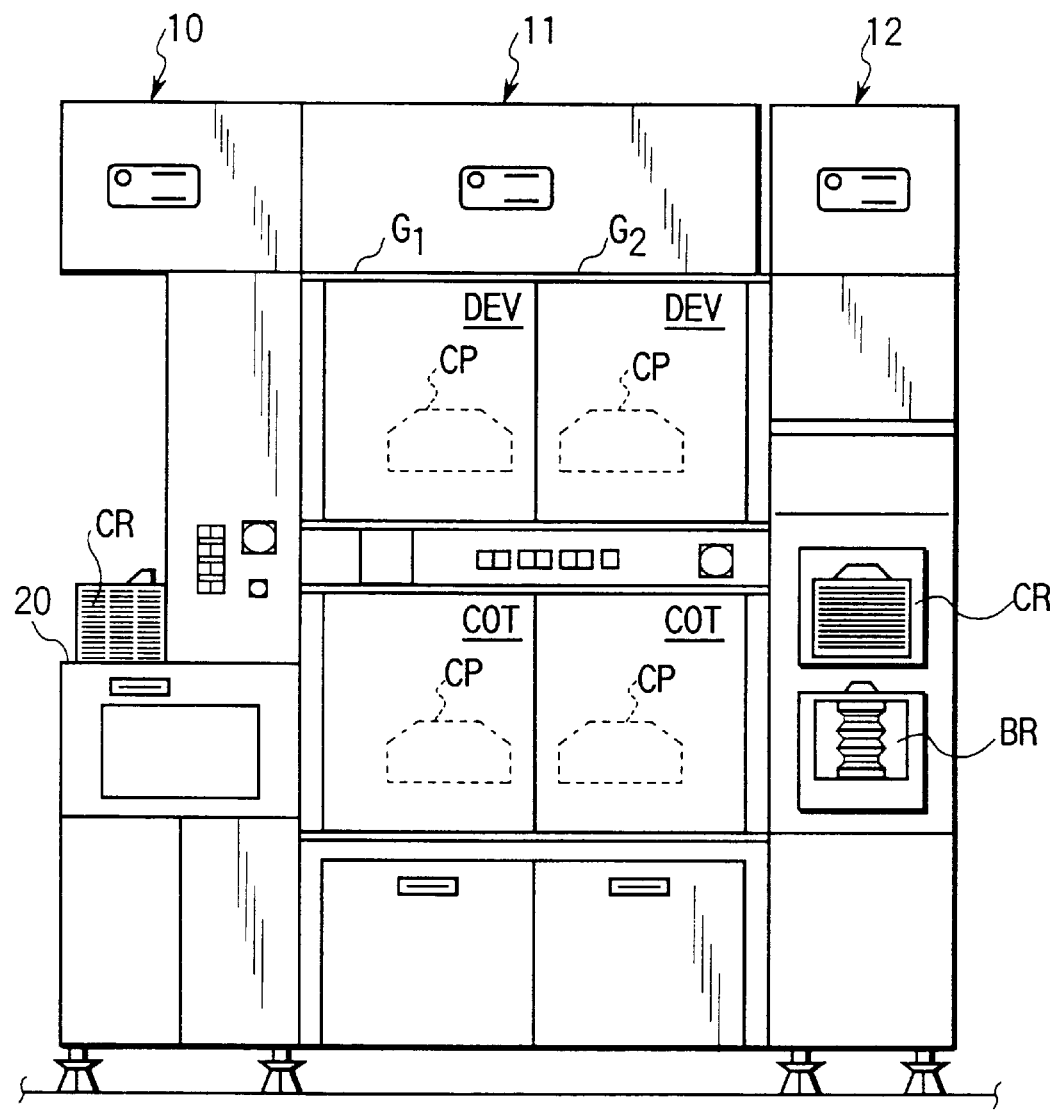
FIG. 2 is a front view showing the structure of the coating/developing process system of FIG. 1.

As shown in FIG. 2, in the first process unit group G1, two spinner-type process units, for example, a resist coating unit (COT) and a developing unit (DEV), are stacked in the order mentioned from the bottom. The spinner-type process unit used herein refers to a process unit in which a predetermined treatment is applied to the wafer W mounted on a spin chuck placed in a cup CP. Also, in the second process unit group G2, two spinner process units such as a resist coating unit (COT) and a developing unit (DEV), are stacked in the order mentioned from the bottom. It is preferable that the resist coating unit (COT) be positioned in a lower stage from a structural point of view and in consideration of troubles in maintenance of a resist-solution discharge. However, if necessary, the coating unit (COT) may be positioned in the upper stage.

As shown in FIG. 3, in the third process unit group G3, open-type process units, for example, a cooling unit (COL) for applying a cooling treatment, an adhesion unit (AD) for applying an adhesion treatment to increase the deposition properties of the resist, an alignment unit (ALIM) for performing alignment (ALIM), an extension unit (EXT), pre-baking units (PREBAKE) for heating a wafer before light-exposure, and post-baking units (POBAKE) for heating a wafer after light exposure, are stacked in eight stages in the order mentioned from the bottom. The open type process unit used herein refers to the process unit in which a predetermined treatment is applied to a wafer mounted on the cassette table SP. Similarly, in the fourth process unit G4, open type process units, for example, a cooling unit (COL), an extension/cooling unit (EXTCOL), an extension unit (EXT), a cooling unit (COL), pre-baking units (PREBAKE) and post-baking units (POBAKE) are stacked in eight stages in the order mentioned from the bottom.

Since the process units for low-temperature treatments, such as the cooling unit (COL) and the extension/cooling unit (EXTCOL), are arranged in the lower stages and the process units for high-temperature treatments, such as the prebaking unit (PREBAKE) and the post baking unit (POBAKE) and the adhesion unit (AD) are arranged in the upper stages in the aforementioned unit groups, thermal interference between units can be reduced. These process units may be arranged at random.

The interface section 12 has the same size as that of the process station 11 in the X direction but shorter in the width direction. A movable pickup cassette CR and an unmovable buffer cassette BR are stacked in two stages in the front portion of the interface section 12. On the other hand, an optical edge bead remover 23 is arranged in the back portion thereof and a wafer carrier 24 in the center portion. The wafer transfer carrier 24 moves in the X- and Z-directions to gain access to both cassettes CR and BR and the optical edge bead remover 23. The wafer carrier 24 is also designed rotatable in the θ direction, so that it can gain access to the extension unit (EXT) belonging in the fourth multiple-stage process unit group G4 in the process station 11 and a wafer deliver stage (not shown) abutted against the exposure unit.

In the coating/developing process system 1, the fifth multiple-stage process unit group G5 (indicated by a broken line) is designed to be arranged in the back side of the main wafer mechanism 22, as described above. The fifth multiple-stage process unit group G5 is designed to be shifted sideward along a guide rail 25 as viewed from the main wafer transfer mechanism 22. Hence, when the fifth multiple-stage process unit group G5 is positioned as shown in the figure, a sufficient space is obtained by sliding the fifth process unit group G5 along the guide rail 25. As a result, a maintenance operation to the main wafer transfer mechanism 22 can be easily carried out from the back side. To maintain the space for maintenance operation to the main wafer transfer mechanism 22, the fifth process unit group G5 may be not only slid linearly along the guide rail 25 but also shifted rotatably outward in the system as shown by a double-headed arc arrow of a dash-dotted line in FIG. 1.

Figure 4:
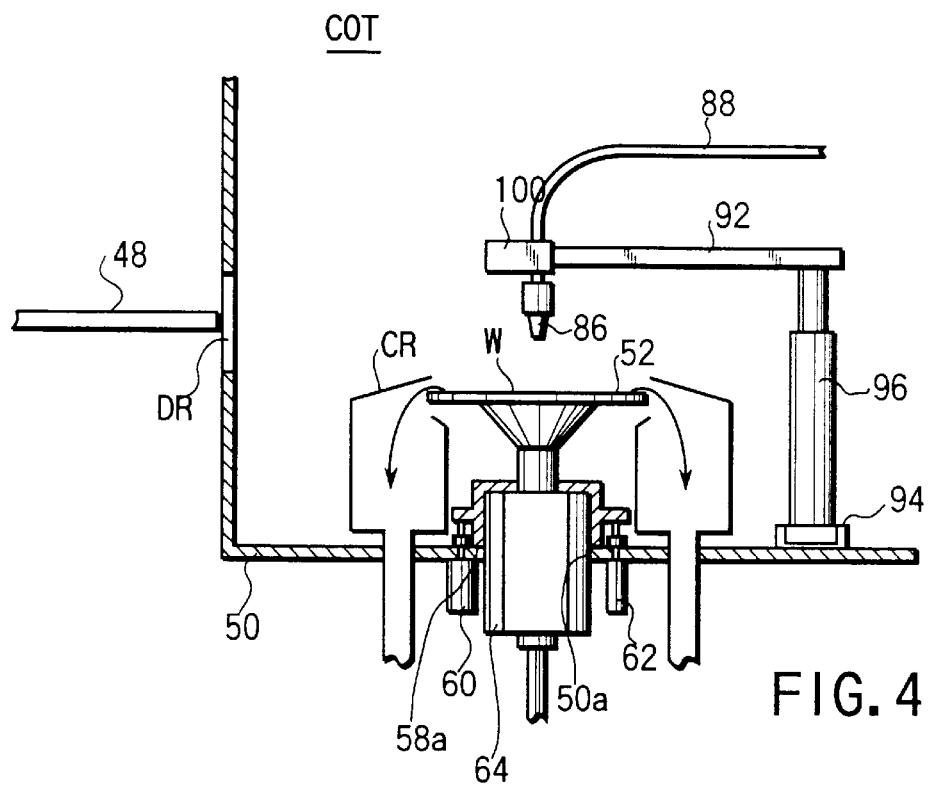
FIG. 4 is a cross-sectional view of a resist coating unit in the coating/developing process system of FIG. 1.
Figure 5:
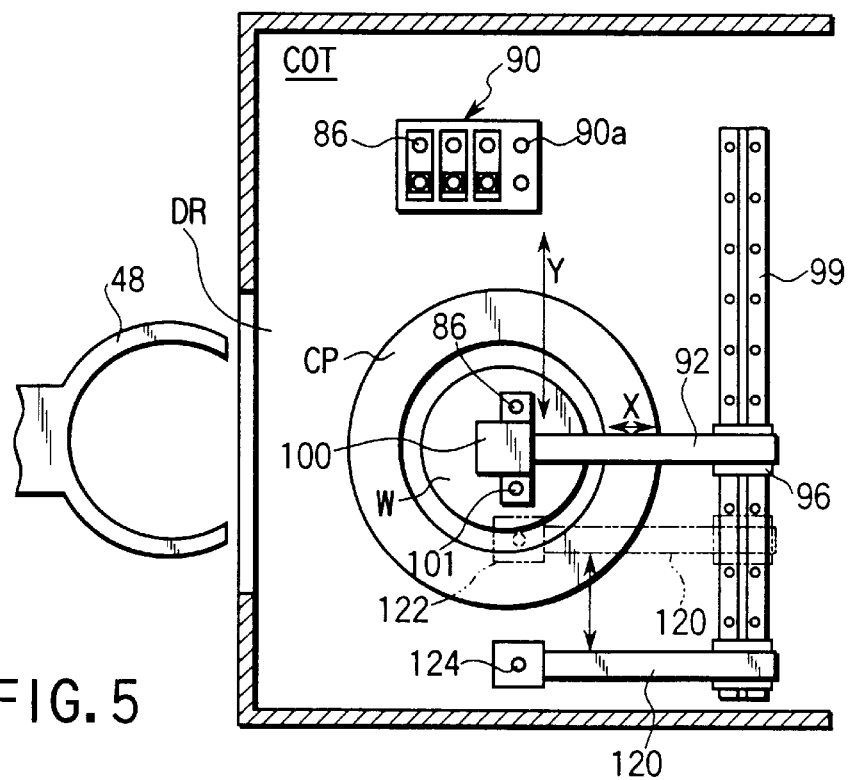
FIG. 5 is a plan view showing an entire structure of the resist coating unit of FIG. 4.

Now, the resist coating unit (COT) according to this embodiment will be explained. FIGS. 4 and 5 are a schematic cross-sectional view and a schematic plan view of an entire structure of the resist coating unit (COT).

A circular cup CP is positioned at the center of the resist coating unit (COT). A spin chuck 52 is positioned within the circular cup CP. The spin chuck 52 with a semiconductor wafer W fixed thereon by vacuum absorption, is rotated by a driving motor 54. The driving motor 54 is liftably arranged at an opening 50a provided in a unit bottom plate 50. The driving motor 54 is further connected to an up-and-down drive machine 60 including an air cylinder and to an up-and-down guide unit 62 via a cap-form flange member 58 (e.g. made of aluminium). A cylindrical cooling jacket 64 made of, for example, stainless steel (SUS), is provided at the side surface of the driving motor 54. The flange member 58 is provided so as to cover the upper half portion of the cooling jacket 64.

When the resist is coated, a lower end 58a of the flange member 58 comes in tight contact with the unit bottom plate 50 at the outer circumference portion of the opening 50a. In this manner, the unit is sealed airtightly. When the semiconductor wafer W is delivered between the spin chuck 52 and the holding member 48 of the main wafer transfer mechanism 22, the up-and-down drive machine 60 lifts the driving motor 54 together with the spin chuck 52 upwards, thereby separating the lower end of the flange member 58 upward from the unit bottom plate 50.

A resist nozzle 86 for supplying a resist solution to the surface of the semiconductor wafer W is connected to a resist supplier (described later) via a resist feed pipe 88. The resist nozzle 86 is detachably provided at an top end portion of a resist nozzle scan arm 92 via a nozzle supporter 100. The resist nozzle scan arm 92 is provided at the top portion of a vertical supporting member 96 which is horizontally movable along the guide rail 94 provided in one direction (the Y-axis) on the unit bottom 50. The resist scan nozzle arm 92 therefore moves in the Y-axis direction together with the vertical supporting member 96 by a Y-axis driving mechanism (not shown).

To mount the resist nozzle 86 selectively on the resist nozzle scan arm 92 in a resist nozzle standby unit 90, the resist nozzle scan arm 92 is movable in the X-direction (perpendicular to Y-direction) other than the Y-direction by an X-direction driving mechanism (not shown).

Furthermore, the outlet of the resist nozzle 86 is inserted into a solvent atmosphere chamber from a port 90a in the resist nozzle standby unit 90. However, even if the tip of the resist nozzle 86 is exposed to the solvent atmosphere, it is designed such that the resist solution attached to a tip of the resist nozzle 86 is not solidified or degraded. Since a plurality of resist nozzles 86 are provided, a different nozzle is selected depending upon a type of resist solution provided.

The nozzle holder 100 of the resist nozzle scan arm 92 is equipped with a thinner nozzle 101 for feeding a liquid agent such as thinner to the wafer surface in order to prewet the wafer surface before the resist solution is supplied. The thinner nozzle 101 is connected to a thinner supplier (described later) by way of a thinner feeding tube (not shown). The thinner nozzle 101 and the resist nozzle 86 are fixed at the nozzle holder 100 in such a way that outlets thereof are placed in line along the Y-axis direction of the resist nozzle scan arm 92 moving directions.

Provided on the guide rail 94 are not only the vertical supporting member 96 for supporting the resist nozzle scan arm 92 but also a vertical supporting member 122 (movable in the Y direction) for supporting a rinse nozzle scan arm 120. The tip portion of the rinse nozzle scan arm 120 is equipped with a rinse nozzle 124 for side rinsing. The rinse nozzle scan arm 120 and the rinse nozzle 124 are moved in parallel or in line between the rinse nozzle standby position (indicated by a solid line) set sideward of the cup CP and a rinse solution spurting position (indicated by a dotted line) set right above the circumference of the semiconductor wafer W mounted on the spin chuck 52, by a Y-axis driving mechanism (not shown).

Figure 6:
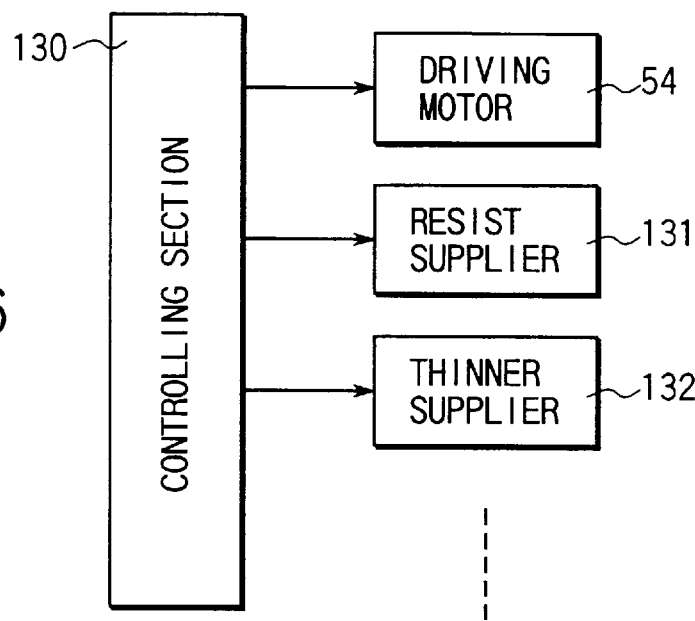
FIG. 6 is a block diagram of a control system of the resist coating unit of FIG. 4.

FIG. 6 shows a construct of a control system of the resist coating unit (COT).

A controller 130 controls individual sections of the resist coating unit (COT), such as the driving motor 54, a resist supplier 131, and a thinner supplier 132. For example, the controller 130 controls the rotational speed of the driving motor 54 in three steps during the resist coating. In addition, the controller 130 controls resist solution feeding from the resist supplier 131 to the resist nozzle 86 and thinner feeding from the thinner supplier 132 to the thinner nozzle 101.

Next, we will explain how to coat resist on a substrate in the resist coating unit (COT) thus constructed.

When the semiconductor wafer W is transferred into a position right above the cup CP within the resist coating unit (COT) by the holding member 48 of the main wafer transfer mechanism 22, the semiconductor wafer is vacuum-absorbed on the spin chuck 52 which can ascend by the up-and-down drive machine 60 (an air cylinder) and the up-and-down guide unit 62. After the semiconductor wafer W is vacuum-absorbed on the spin chuck 52, the holding member 48 of the main wafer transfer mechanism 22 is moved back from the resist coating unit (COT). In this manner, the semiconductor wafer W is completely delivered to the resist coating unit (COT).

Subsequently, the spin chuck 52 is moved down so as to move the semiconductor wafer W to a predetermined position in the cup CP and then rotation of the spin chuck 52 is initiated by the driving motor 54. Thereafter, the nozzle supporter 100 starts moving from the resist nozzle standby unit 90 along the Y-axis.

A supply to the surface of the rotating semiconductor wafer W is initiated when the outlet of the thinner nozzle 101 arrives at the center of the spin chuck 52 (the center of the semiconductor wafer W). The supplied solvent onto the wafer surface is uniformly spread by centrifugal force over the entire region from the wafer center to the peripheral region thereof.

Following that, the nozzle supporter 100 is moved in the Y direction until the outlet of the resist nozzle 86 arrives at the center of the spin chuck 52. Upon the arrival of the nozzle at the center, the dropwise supply of the resist solution to the center of the semiconductor wafer surface from the outlet of the resist nozzle 86 is initiated, thereby coating resist over the wafer surface.

In this embodiment, the rotational speed of the driving motor 54, in other words, the rotational speed of the semiconductor wafer W during the resist coating is controlled in the following manner:

| Step | Time | Speed | Acceleration | supplied solution |
| --- | --- | --- | --- | --- |
| 1 | 1.0 | 0 | 10,000 | |
| 2 | 1.5 | 0 | 10,000 | Thinner |
| 3 | 1.0 | 2,000 | 10,000 | |
| 4 | 2.0 | 4,500 | 10,000 | Resist |
| 5 | 1.0 | 2,000 | 30,000 | |
| 6 | 30.0 | 3,000 | 10,000 | |

Rotation of the semiconductor wafer W is initiated (Step 1). At one second after the rotation is initiated, a thinner supply from the thinner nozzle 101 to the center of the semiconductor wafer W is initiated (Step 2). The thinner supply is terminated although the rotation of the semiconductor wafer W is still continued (Step 3). In this step, thinner is spread uniformly from the center of the semiconductor wafer W to the peripheral region.

Figure 7A:
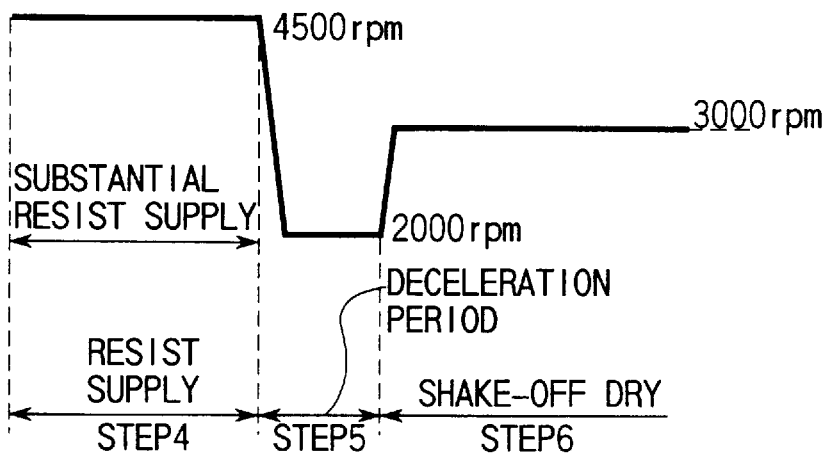
FIG. 7A is a graph showing a profile of semiconductor wafer rotational control in the resist coating unit of FIG. 4.

As shown in FIG. 7A, while the semiconductor wafer W is being rotated at 4500 rpm in Step 4, a resist solution supply from the resist nozzle 86 to the center of the semiconductor wafer W is initiated and continued for 2 seconds. After termination of the resist solution supply, the rotation speed of the semiconductor wafer W is drastically reduced (Step 5) to 2000 rpm. After the semiconductor wafer W is rotated at as low a speed as 2000 rpm for one second, the rotation of the semiconductor or wafer W is increased (Step 6). The semiconductor wafer W is then rotated at 3000 rpm. In the step 6, the semiconductor wafer is dried by shaking off the resist solution coated on the surface thereof.

For comparison, we will show how to control the rotation of the semiconductor wafer W in a conventionally used method:

| Step | Time | Speed | Acceleration | supplied solution |
| --- | --- | --- | --- | --- |
| 1 | 1.0 | 0 | 10,000 | |
| 2 | 1.5 | 0 | 10,000 | Thinner |
| 3 | 1.0 | 2,000 | 10,000 | |
| 4 | 3.0 | 4,500 | 10,00 | Resist |
| 5 | 30.0 | 3,000 | 10,000 | |

In this embodiment, rotation of the semiconductor wafer W is initiated in Step 1. At one second after the initiation of rotation, a thinner supply to the center of the semiconductor wafer W is initiated (Step 2). The thinner supply is terminated although the rotation of semiconductor wafer W is still continued (Step 3).

Figure 7B:
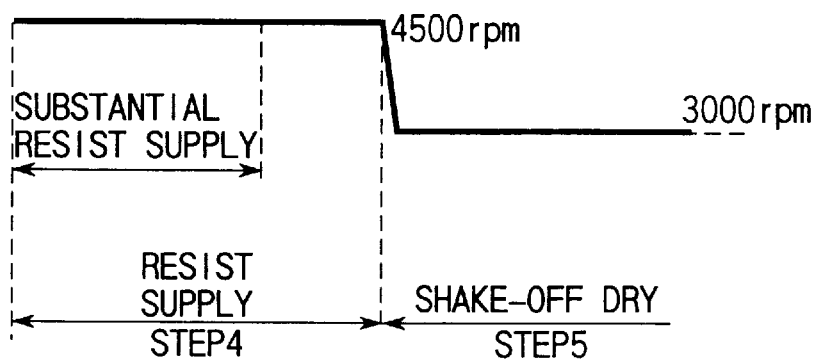
FIG. 7B is a graph showing a profile of the semiconductor wafer rotational control in a conventionally-used resist coating unit.

As shown in FIG. 7B, while the semiconductor wafer W is being rotated at 4500 rpm, the resist solution is supplied to the center and continued for 2 seconds (Step 4). The rotational speed of the semiconductor wafer W is reduced to 3000 rpm to shake off the resist solution (Step 5). In this way, the wafer W is dried.

The rotational control of the semiconductor wafer W performed in the resist coating step of this embodiment (shown in FIG. 7A) is compared to that of a conventional rotation control (shown in FIG. 7B). The manner of this embodiment differs from that of the conventional manner in that the semiconductor wafer W is rotated at as low a speed as 2000 rpm in Step 5 right after the termination of the resist solution. By virtue of the presence of this step, the resist solution can be coated uniformly on the surface of the semiconductor wafer W without leaving ripples on the surface thereof.

The mechanism for preventing the generation of ripples is explained with reference to FIGS. 8A to 8D and FIGS. 9A to 9D. FIGS. 8A to 8D show a conventional case. FIGS. 9A to 9D show the case of this embodiment.

Figure 8A:
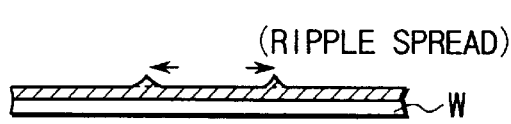
FIGS. 8A to 8D are views for explaining how to generate ripples in a conventional apparatus.
Figure 8B:
Figure 8C:
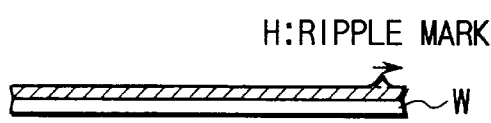
Figure 8D:
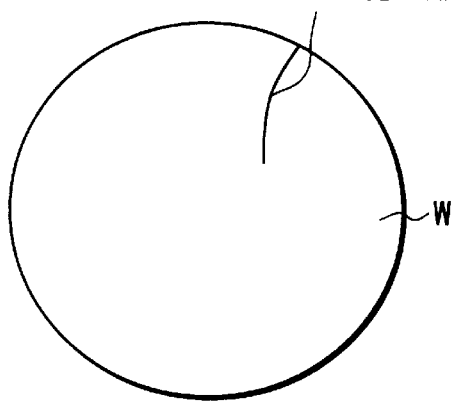

In the conventional case, ripple H is generated at the center of the semiconductor wafer W right after the termination of the resist solution supply, is spread toward the periphery of the semiconductor wafer by centrifugal force, as shown in FIG. 8A. Since the semiconductor wafer W is rotated at as high a speed as 4,500 rpm, the resist solution spread over the semiconductor wafer surface starts getting dry, as shown in FIG. 8B. Since the semiconductor wafer W is dried by shaking off the resist solution in this way, ripples H are left on the surface of the semiconductor wafer, as shown in FIGS. 8C to 8D.

Figure 9A:
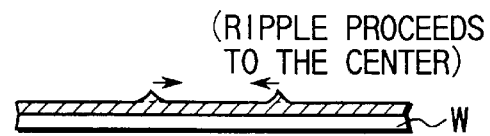
FIGS. 9A to 9D are views for explaining how to prevent the generation of ripples in an embodiment of the present invention.
Figure 9B:
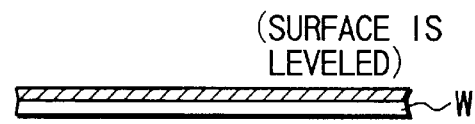
Figure 9C:
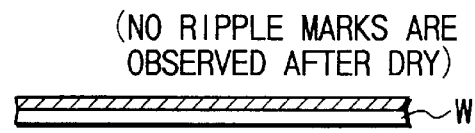
Figure 9D:
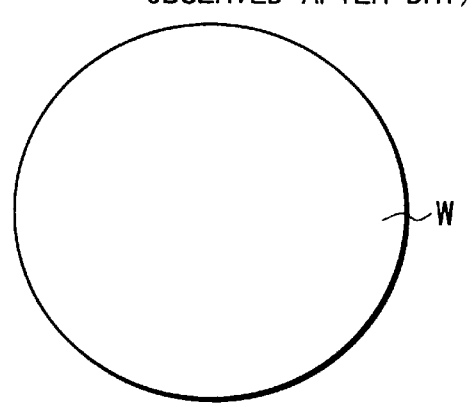

In the case of this embodiment, in contrast, the rotational speed of the semiconductor wafer W is once reduced to as low as 2000 rpm in Step 5 which is performed right after the termination of the resist solution. At this point, the ripples which have been spread outward by centrifugal force are then moved back toward the center, as shown in FIG. 9A. Thereafter, the semiconductor wafer W continues to rotate at as low a speed as about 2000 rpm, so that the dehydration of the resist solution does not proceed as shown in FIG. 9B. The resist solution containing ripples H is thus leveled. Following that, the semiconductor wafer W is dried by shaking off the resist solution, with the result that the resist solution is coated uniformly without forming ripples on the semiconductor surface, as shown in FIGS. 9C to 9D.

In addition, the semiconductor wafer W is rotated at as low a speed as 2000 rpm in Step 5 right after the termination of the resist solution supply in this embodiment, the film is prevented from being further reduced in thickness. It is therefore possible to form a resist film uniformly with a predetermined thickness. To the contrary, in the conventional method, the semiconductor wafer W is rotated at a considerably high speed in excess of 3000 rpm right after the termination of the resist solution supply in order to reduce resist consumption. The resist film becomes thinner during the high speed operation but sometimes fails in uniformity. To reiterate, since the rotation speed of the semiconductor wafer W is reduced drastically to a low speed of 2000 rpm after the supply of the resist solution in this embodiment, the resist film is not reduce drastically in thickness and therefore is of a predetermined thickness.

In the embodiment mentioned above, there have been explained the case where the present invention is applied to the apparatus for coating a resist solution to a semiconductor wafer. The present invention can be applied to an apparatus for coating a resist solution over a substrate except a semiconductor wafer, such as an LCD substrate.

The embodiment mentioned above is explained by exemplifying specific rotation numbers and the like. The present invention is not limited to the rotation numbers mentioned. The substrate may be rotated at any rotational velocity as long as such can be drastically reduced to a low rotation number right after termination of the resist solution supply.

According to the present invention detailed in the foregoing, the rotational velocity of the substrate is drastically reduced after termination of the resist solution supply and the substrate is rotated at a low speed to shake off the resist solution and dried. It is therefore possible to coat the resist solution uniformly over a substrate surface without leaving ripples etc.

According to the embodiment mentioned above, the substrate is rotated at a low speed until dried by shaking off the resist solution. It is therefore possible to form a resist film uniformly with a desired thickness.

According to the present invention, after a prewetting liquid is supplied to a substrate surface, a resist solution is coated on the substrate surface. It is therefore possible to enhance the effect of coating the resist solution uniformly on the substrate surface without leaving ripple marks etc.

Another embodiment of a photoresist coating method and apparatus will now be explained which is capable of forming a coating film uniformly with a predetermined thickness even if the dropwise supply of the resist solution to the semiconductor surface is reduced in amount.

The resist coating apparatus of this embodiment is constructed basically in the same manner as in the former embodiment. Explanation of the structure thereof is therefore omitted herein. Operation of the resist coating apparatus will now be explained on the basis of the photoresist coating method of this embodiment.

When the wafer W is transferred to a position right above the cup CP within the resist coating unit by the holding member 48 of the main wafer transfer mechanism 22, the wafer W is vacuum-absorbed by the spin chuck 52 moved up by the up-and-down driving machine 60 including an air cylinder and the up-and-down guide unit 62. After the semiconductor wafer W is vacuum-absorbed on the spin chuck 52, the holding member 48 of the main wafer transfer mechanism 22 is moved back from the resist coating unit (COT). In this manner, the semiconductor wafer W is completely loaded into the resist coating unit (COT).

Subsequently, the spin chuck 52 is moved down so as to move the semiconductor wafer W to a predetermined position within the cup CP and then rotation of the spin chuck 52 is initiated by the driving motor 54. Thereafter, the nozzle supporter 100 starts moving from the resist nozzle standby unit 90 along the Y direction.

When the outlet of the thinner nozzle 101 arrives at the center of the spin chuck 52 (the center of the semiconductor wafer W), a solvent, for example, thinner, is supplied onto the surface of the rotating semiconductor wafer W. The solvent supplied onto the wafer surface is uniformly spread by centrifugal force over an entire peripheral region.

Following that, the nozzle supporter 100 is moved in the Y direction until the outlet of the resist nozzle 86 arrives at the center of the spin chuck 52 (the center of the wafer). The resist solution is then supplied in a dropwise manner to the center of a rotating semiconductor wafer surface from the outlet of the resist nozzle 86, thereby coating resist over the wafer surface.

Figure 10:
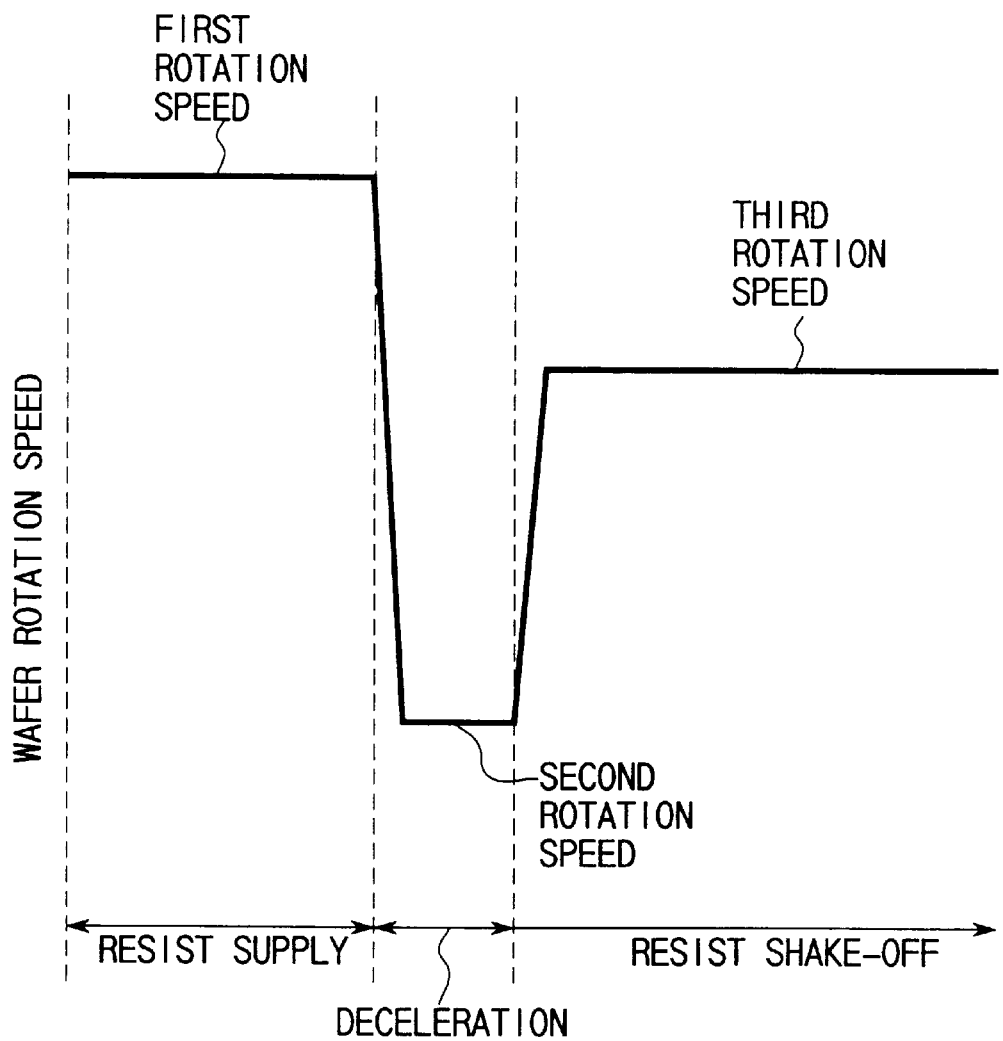
FIG. 10 is a graph showing the profile of the rotational control of the resist coating apparatus.

In this embodiment, the rotation number of wafer W (rotation number of the driving motor 54) is controlled in the manner shown in the steps (a) to (c) (also shown in FIG. 10).

(a) While the wafer W is being rotated at a first rotation speed, a resist solution is supplied in a dropwise manner to substantially to a center of the wafer W from a resist nozzle 86. The resist solution is coated over the wafer W by spreading it outward thereof.

(b) After completion of the dropwise supply of the resist solution, the rotational speed of the wafer W is reduced to a second rotational speed which is slower than the first rotation speed and the third rotation speed described below.

(c) Thereafter, the wafer rotation speed is increased to the third rotation speed which is slower than the first rotational speed and faster than the second rotational speed, to thereby shake off an excess resist solution.

Steps (a) and (c) employed herein are the same as those of a conventional method. The first rotation speed is set to, for example, 4500 rpm. The third rotation speed is set to, for example, 3000 rpm. Step (b) is an intrinsic step to this embodiment. In step (b), the wafer rotation speed is reduced to the second rotational speed only for a predetermined time-period right after completion of the dropwise resist solution supply. The thickness of the wafer W, particularly, the film thickness of the peripheral portion of the wafer W is controlled during this step. In this case, the lower the second rotational speed, the higher the deceleration speed for reducing the rotation speed up to the second rotational speed, and the longer the deceleration time, the thicker the film thickness of the peripheral portion. This is because when the rotational speed is reduced to as low a speed as the second rotational speed, force directing toward the center of the wafer W, produced by the deceleration, acts upon the resist solution present on the semiconductor wafer W. In addition, since the rotational speed of the substrate is low, the resist solution is dried slowly. As a result, the resist film is obtained with a uniform thickness. More specifically, the amount of the resist solution spread outward of the wafer W is suppressed by the force directing toward the center of the wafer, produced by the deceleration. In this mechanism, almost the same volume of the resist solution is applied to not only the center portion but also the peripheral portion. The amount of the resist solution present on the peripheral portion is considered to increase, the slower the second rotational speed, the larger the deceleration of the second rotational speed, and the longer the time required for deceleration, as described above. It follows that the film formed in the peripheral portion of the wafer becomes thick by the increase.

In the conventional spin-coating method (that is a method of shaking off the resist solution without deceleration of the rotational speed, after completion of the dropwise supply of the resist solution), when the dropwise supply volume of the resist solution to the semiconductor wafer W is reduced, the resist solution dries before the resist solution supplied is spread outward sufficiently. It follows that the resultant film is thinner in the peripheral portion than in the center portion. It is therefore difficult to control the thickness of the coated film.

In the spin coating method according to this embodiment, the volume of the resist solution deposited on the center portion is equal to that on the peripheral portion by reducing the rotation speed to a second rotational speed during the coating step. As a result, the film thickness of the peripheral portion is as thick as that of the center portion. In other words, the thickness of the resist film can be adjusted in the reduced rotation speed so that the resist film is formed uniformly in thickness over the entire wafer surface. In addition, even if the amount of the resist solution supplied dropwise to the wafer W is reduced, the coated film can be formed uniformly in a predetermined thickness. The present invention is therefore extremely effective in reducing the consumption of the resist solution.

In this case, to form a film of a uniform thickness, the wafer is preferably rotated at a second rotation speed of 1000 rpm or less, and more preferably, 100 to 200 rpm, for 1 to 3 seconds.

Before the resist coating, if the entire surface of the semiconductor wafer W is wetted with a solvent such as thinner as described above, i.e., subjected A prewetting treatment, the resist can be more easily spread. As a result, the uniform resist film can be formed with a smaller amount of the resist solution. In other words, resist consumption can be further reduced.

The present invention is not limited to the aforementioned embodiments and can be modified in various ways. The rotational speed is reduced to the second rotational speed after termination of the resist supply in the aforementioned embodiments; however, it is not necessary to reduce the rotational speed after the termination of the resist supply. In other words, the rotation of the wafer may be decelerated before or during the resist supply. It should be however, noted that it is preferable to reduce the rotational speed after the termination of the resist supply to save resist. Furthermore, prewet treatment is performed with thinner in the aforementioned embodiments; however, even if the prewet treatment is not performed, the effect of the present invention can be obtained.

In the embodiments, we will explain the apparatus for coating a resist solution on the semiconductor wafer.

However, the present invention may be applied to the case where a resist solution is coated on a substrate except the semiconductor wafer, for example, an LCD substrate.

Next, we will explain how to control the film thickness in accordance with the embodiments of the present invention, more specifically.

A silicon wafer (8 inch) was first set on the spin chuck and the rotation of the wafer was initiated. One second later, thinner (2.0 cc) was supplied. The wafer was prewetted for one second while rotating at a speed of 2000 rpm. Thereafter, the rotational speed of the wafer was increased up to 3500 rpm (acceleration: 10000 rpm/sec). The resist solution was supplied while rotating at this speed.

Figure 11:
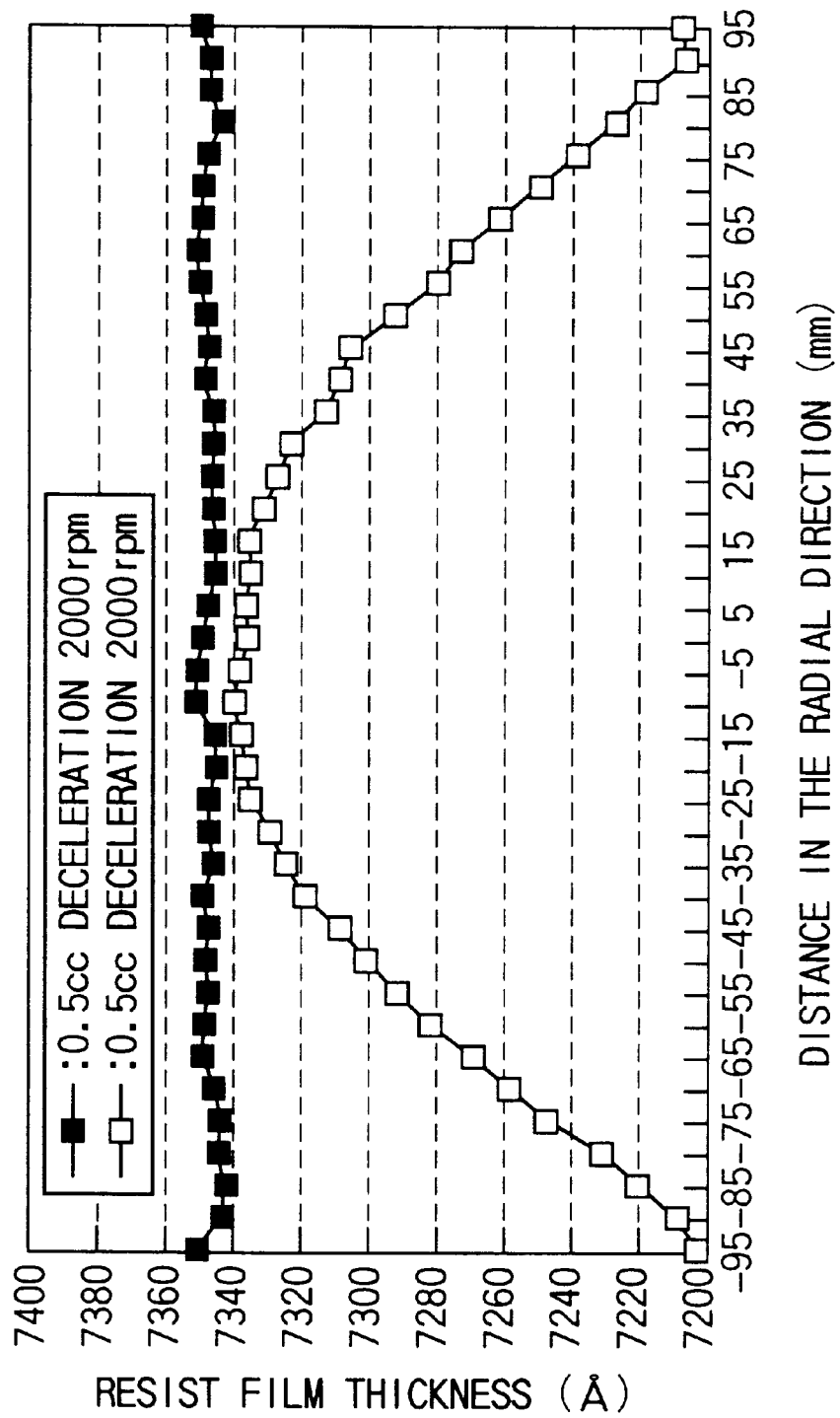
FIG. 11 is a graph of thickness distribution of a resist film in a wafer plane, formed by the conventionally-used photoresist coating method.

A resist film was formed by the steps of supplying the resist solution in an amount of 1.5 cc, reducing the rotational speed to 2000 rpm in accordance with the conventional manner, and shaking off the resist solution to dry. Another resist film was formed in the same manner as in the above except that the resist solution was supplied in an amount of 0.5 cc. The profiles of the film-thickness distribution of the resist films on the wafer thus obtained were compared as shown in FIG. 11. The resist film was obtained with a nearly uniform thickness when the resist solution was supplied in an amount of 1.5 cc; whereas such was when the resist solution was supplied in an amount of 0.5 cc. In the latter case, the film thickness of the peripheral portion was significantly thin compared to the central portion.

Figure 12:
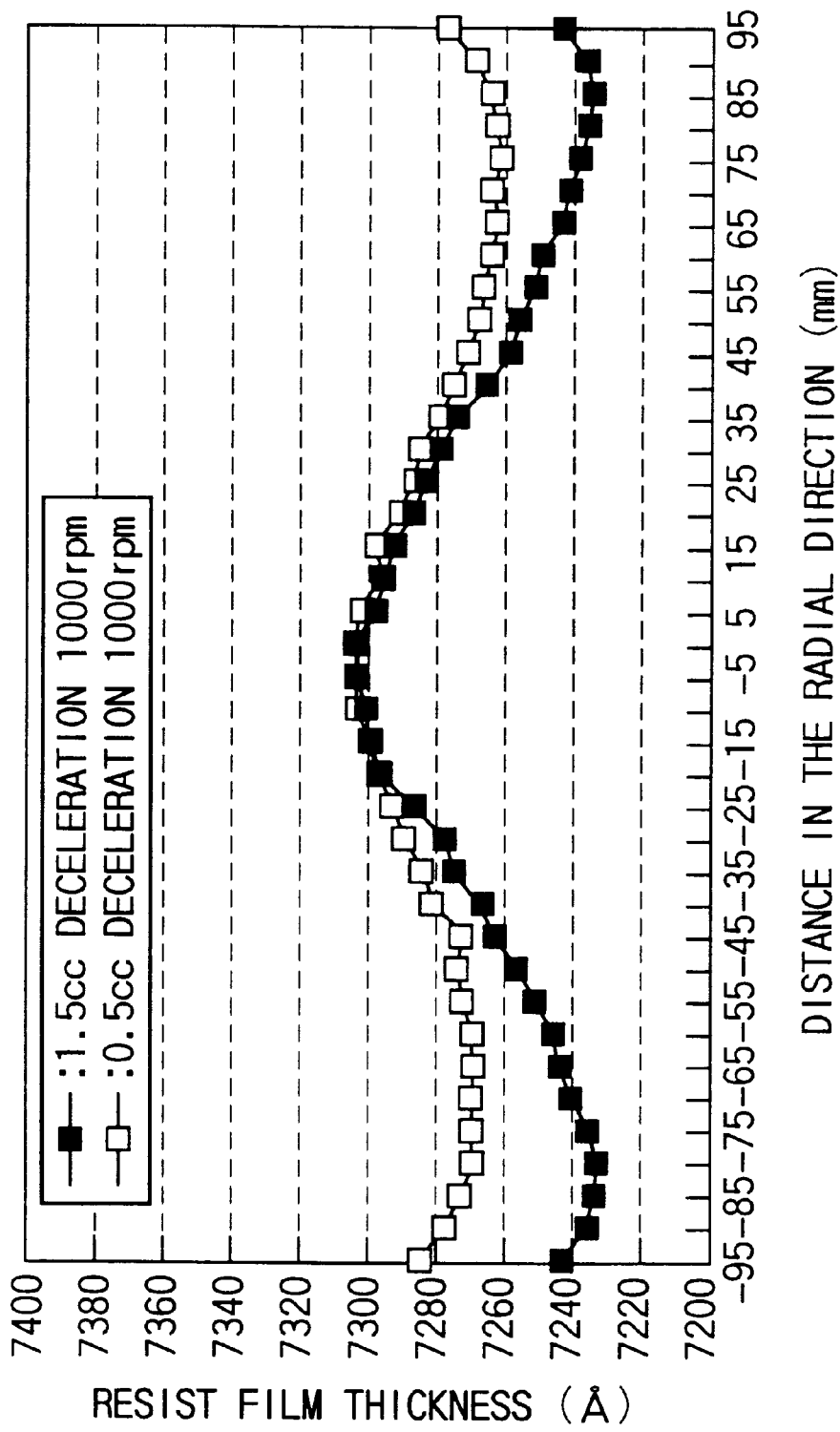
FIG. 12 is a graph of thickness distribution of a resist film in a wafer plane, formed by the photoresist coating method of the present invention.

Next, a resist film was formed by the steps of supplying the resist solution in an amount of 0.5 cc, reducing the rotational speed of the wafer to 100 rpm within the range of the present invention (acceleration: 30000 rpm/sec), and maintaining the rotational speed for 1.0 sec, increasing the rotational speed to shake off the resist solution to dry. Another resist film was formed in the same manner except that the rotational speed of 100 rpm was maintained for 1.5 sec after the speed reduction. From the results shown in FIG. 12, it was confirmed that the resist film is formed in a uniform thickness if the rotational speed is reduced to 100 rpm or less after the resist solution is supplied. In particular, the uniformity of the resist film is improved if the wafer is rotated at the rotational speed of 100 rpm for a longer period, 1.5 sec.

Next, the variance in thickness of the resist film in the same wafer plane was checked with respect to 50 resist films formed under the conditions: the rotation speed after the speed reduction: 100 rpm, was maintained for 1.5 sec. The coating was performed under the conditions shown in Table 1 and a resist temperature: 22.2° C., inner temperature and humidity of the cup: 23.0° C. and 45.0%.

| Step | Time (sec) | Speed (rpm) | Acceleration (rpm/sec) | supplied solution |
| --- | --- | --- | --- | --- |
| 1 | 1.0 | 0 | 10,000 | |
| 2 | 1.5 | 0 | 10,000 | Thinner |
| 3 | 1.0 | 2,000 | 10,000 | |
| 4 | 1.0 | 3,500 | 10,000 | Resist |
| 5 | 1.5 | 100 | 30,000 | |
| 6 | 30.0 | 2,390 | 10,000 | |

Rotation of the wafer was initiated (Step 1). One second later, thinner was supplied to the center of the wafer (Step 2). After termination of the thinner, the wafer was rotated at 2000 rpm for 1.0 second (Step 3). Thereafter, the rotation speed of the wafer was increased to 3,500 rpm and the resist solution was supplied to the center of the wafer (Step 4).

After the resist solution supply was terminated, the rotational speed of the wafer was reduced to 100 rpm and maintained for 1.5 sec. (Step 5). Then, the resist solution was shaken off at a speed of 2,390 rpm to dry the wafer.

Figure 13:
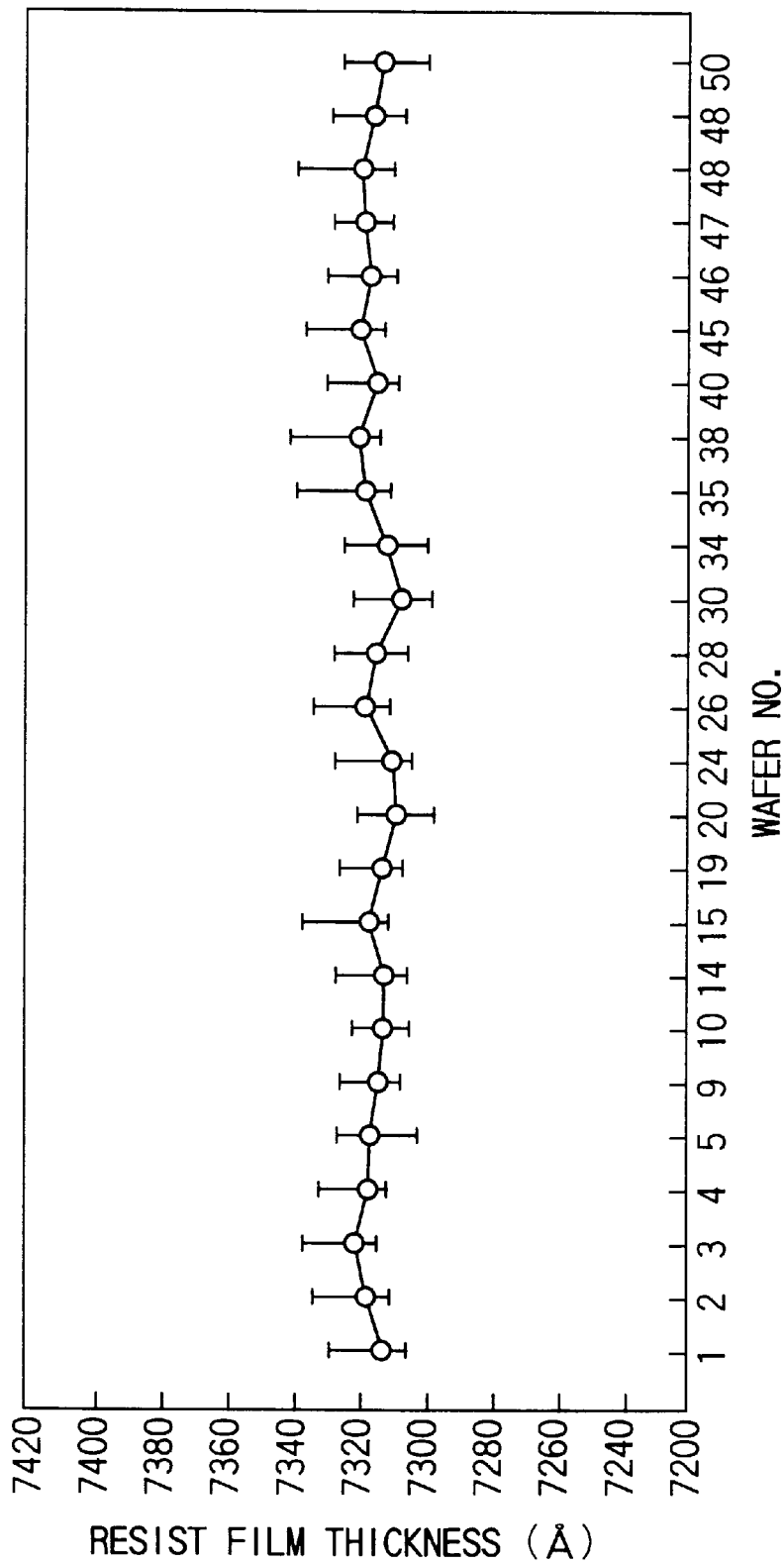
FIG. 13 is a graph showing variance in thickness of the resist film in a wafer plane, formed by the photoresist coating method of the present invention.

As a result, variance in thickness in a single wafer plane and variance in thickness in all wafers are shown in Table 2 and FIG. 13. It is demonstrated that the variances in thickness of a single wafer plane and of all wafers are small.

|  | Average (angstrom) | Range (angstrom) | 3 σ (angstrom) |
| --- | --- | --- | --- |
| Single wafer plane | 7307.41–7325.59 | 14.00–25.00 | 9.21–17.49 |
| All wafers | 7317.09 | 41.00 | 18.06 |

The film thickness was measured by selecting 39 points in the radial direction of the wafer except the edge area of 5 mm.

As explained in the embodiments of the present invention, the resist solution can be supplied equally to the peripheral portion and the center portion by reducing the rotational speed of the substrate during the resist coating step. Therefore, the resist film can be formed uniformly over the entire substrate region, even if the supply amount of the resist solution is reduced. Accordingly, the method of the present invention is extremely effective in reducing the consumption of the resist solution.

Since the surface-prewetting liquid is supplied before the resist coating, a resist film can be formed uniformly even if the resist solution is supplied in a lower amount. It is therefore possible to reduce the consumption of the resist more effectively. In addition, the resist film can be formed so as to be thin.

Since the resist film is formed uniformly by reducing the rotational speed of the substrate after termination of the resist supply, the supply amount of the resist can be further reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A resist coating method comprising the steps of:
   supplying a resist solution to substantially a center of a surface of a substrate while the substrate is rotated at a first speed;
   decelerating the rotation of the substrate from the first speed to a second speed after the supply of the resist solution is terminated; and
   accelerating the rotation of the substrate from the second speed to a third speed to remove excessive resist solution after the substrate is rotated at the second speed for a predetermined time-period.

2. A resist coating method according to claim 1, further comprising the step of supplying a liquid agent for wetting the substrate surface to the substrate surface before the step of supplying the resist solution.

3. A resist coating method according to claim 1, further comprising the step of supplying a liquid agent for wetting a substrate surface to substantially a center of the substrate surface while the substrate is rotated at a first speed before the step of supplying a resist solution.

4. The resist coating method according to claim 2 or 3, wherein the liquid for wetting the substrate surface is thinner.

5. The resist coating method according to any one of claims 1 to 3, wherein said first, second and third rotation speeds satisfy the following relationship: the first speed>the third speed>the second speed.

6. A resist coating apparatus comprising:
   a substrate holding member configured for holding and rotating a substrate;
   a nozzle configured for supplying a resist solution to substantially a center of the surface of the substrate held by the substrate holding member; and
   a control section comprising a member for rotating the substrate at a first speed by rotating the substrate holding member at the first speed when the resist solution is supplied to the substrate, rotating the substrate at a second speed by decelerating the rotation of the substrate holding member to the second speed after the supply of the resist solution is terminated, and rotating the substrate at a third speed by accelerating the rotation of the substrate holding member from the second speed to a third speed to shake off an excessive resist solution after the substrate holding member is rotated at the second speed for a predetermined time-period.

7. A resist coating apparatus according to claim 6, further comprising
   a second nozzle configured for supplying a liquid agent for wetting a substrate held by the substrate holding member.

8. The resist coating apparatus according to claim 6 or 7, wherein the control unit controls the rotation speed of the substrate holding member so as to satisfy the relationship: the first speed>the third speed>the second speed.

9. A resist coating method comprising the steps of:
   coating a resist solution by spreading the resist solution outward of a substrate while the resist solution is supplied to substantially a center of the substrate which is rotated;
   controlling a film thickness uniformly by once decelerating the rotation of the substrate after the supply of the resist solution is terminated during the resist coating step; and
   shaking off an excessive resist solution by accelerating the rotation of the substrate.

10. A resist coating method according to claim 9, further comprising the step of supplying a liquid agent for wetting the substrate surface to a substrate surface before the step of supplying a resist solution.

11. The resist coating method according to claim 10, wherein said liquid agent is supplied to substantially a center of the substrate surface while the substrate is rotated.

12. The resist coating method according to claim 10 or 11, wherein said liquid agent for wetting the substrate surface is thinner.

13. The resist coating method according to claim 10 or 11, wherein said controlling step decelerates the rotation of the substrate to 1000 rpm or less.

14. A resist coating method comprising:
   coating a resist solution on a surface of a substrate by spreading the resist solution outward of the surface of the substrate while the resist solution is supplied to substantially a center of the surface of the substrate which is rotated at a first speed;

controlling a film thickness uniformly by decelerating the rotation of the substrate from the first speed to a second speed after the supply of the resist solution is terminated; and shaking off an excessive resist solution by accelerating the rotation of the substrate from second speed to a third speed which is slower than the first speed and faster than the second speed.

15. The resist coating method according to claim 14, wherein the second rotation speed is 1000 rpm or less.

16. A resist coating apparatus comprising:

a substrate holding member configured for holding a substrate holding member at various speeds;

a resist-solution nozzle configured for rotating the substrate holding member at various speeds;

a resist-solution nozzle configured for supplying a resist solution to substantially a center of the surface of the substrate held by the substrate holding member; and a control unit comprising a member for controlling the rotating unit to control rotation of the substrate holding member, the control unit controlling the rotating unit to rotate the substrate holding member at a predetermined speed when the resist solution is supplied to the substrate, once decelerating the rotation of the substrate holding member to a speed capable of controlling the film thickness uniformly after the supply of the resist solution is terminated, and thereafter accelerating the rotation of the substrate holding member to shake off an excessive resist solution.

17. A resist coating apparatus comprising:

a substrate holding member configured for holding a substrate having a surface;

a rotation unit configured for rotating the substrate holding member at various speeds;

a liquid-agent nozzle configured for supplying a liquid agent for wetting the surface of the substrate before a resist solution is supplied to substantially a center of the surface of the substrate held by the substrate holding member;

a resist-solution nozzle configured for supplying a resist solution to substantially a center of the surface of the substrate held by the substrate holding member to form a resist film thereon; and a control unit comprising a member for controlling the rotation unit to control rotation of the substrate holding member, the control unit controlling to rotate the substrate holding member at a predetermined speed when the resist solution is supplied to the substrate, once decelerating the rotation of the substrate holding member to a speed capable of controlling a thickness of the resist film uniformly after the supply of the resist solution is terminated, and thereafter accelerating the rotation of the substrate holding member to shake off an excessive resist solution.

18. The resist coating apparatus according to claim 16 or 17, wherein the control unit controls the rotation unit to decelerate the rotation of the substrate holding member to 1000 rpm or less.

19. A resist coating apparatus comprising:

a substrate holding member configured for holding a substrate having a surface;

a rotation unit configured for rotating the substrate holding member at various speeds;

a resist-solution nozzle configured for supplying a resist solution to substantially a center of the surface of the substrate held by the substrate holding member to form a resist film thereon; and a control unit comprising a member for controlling the rotation unit to control rotation of the substrate holding member, the control unit controlling the rotation unit to rotate the substrate holding member at a predetermined speed when the resist solution is supplied to the substrate, once decelerating the rotation of the substrate holding member to a speed capable of controlling a thickness of the resist film uniformly after the supply of the resist solution is terminated, and thereafter accelerating the rotation of the substrate holding member to shake off an excessive resist solution.

20. The resist coating apparatus according to claim 19, wherein the control unit sets the second speed to 1000 rpm or less.

* * * * *

UNITED STATES PATENT AND TRADEMARK OFFICE
CERTIFICATE OF CORRECTION

PATENT NO. : 6,117,486
DATED : 09/12/00
INVENTOR(S): Kosuke YOSHIRARA

It is certified that an error appears in the above-identified patent and that said Letters Patent is hereby corrected as shown below:

Column 17, line 14, change "resist-solution nozzle" to read --rotating unit--.

Signed and Sealed this

First Day of May, 2001

*Attest:*

NICHOLAS P. GODICI

*Attesting Officer*       *Acting Director of the United States Patent and Trademark Office*